United States Patent
Tsuchiya

(10) Patent No.: US 7,176,693 B2
(45) Date of Patent: Feb. 13, 2007

(54) SHORT CIRCUIT DETECTING CIRCUIT AND ABNORMALITY MONITORING SIGNAL GENERATING CIRCUIT

(75) Inventor: Naoya Tsuchiya, Nukata-gun (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 11/142,428

(22) Filed: Jun. 2, 2005

(65) Prior Publication Data
US 2005/0270034 A1    Dec. 8, 2005

(30) Foreign Application Priority Data
Jun. 3, 2004    (JP)    ............... 2004-165787
Feb. 14, 2005    (JP)    ............... 2005-036332

(51) Int. Cl.
*G01R 31/14*    (2006.01)
*G01R 31/28*    (2006.01)

(52) U.S. Cl. ....................... 324/509; 324/522

(58) Field of Classification Search ................ 324/509, 324/522, 771, 772
See application file for complete search history.

(56) References Cited

U.S. PATENT DOCUMENTS

| | | | | |
|---|---|---|---|---|
| 4,780,625 A | * | 10/1988 | Zobel | ............ 327/53 |
| 5,146,159 A | * | 9/1992 | Lau et al. | ............ 324/537 |
| 6,377,053 B1 | * | 4/2002 | Mazzucco et al. | ............ 324/509 |
| 6,710,603 B2 | * | 3/2004 | Gregorius | ............ 324/522 |
| 6,794,880 B2 | * | 9/2004 | Tucker | ............ 324/511 |
| 2003/0151411 A1 | * | 8/2003 | Tucker | ............ 324/510 |
| 2004/0061534 A1 | | 4/2004 | Yamamoto | |
| 2006/0082376 A1 | * | 4/2006 | Allen et al. | ............ 324/522 |

FOREIGN PATENT DOCUMENTS

JP    A-2000-293201    10/2000

* cited by examiner

*Primary Examiner*—Anjan Deb
(74) *Attorney, Agent, or Firm*—Posz Law Group, PLC

(57) ABSTRACT

In order to drive an L load, FETs are disposed so as to be mirror-paired with FETs disposed at the power source side and the ground side respectively, and currents corresponding to mirrored currents of first and second currents flowing in FETs are made to flow in current mirror circuits, and the mirror ratio of the former is set so that the current ratio of the first current ratio is large, and the mirror ratio of the latter is set so that the current ratio of the second current side is large. When the first current is larger than the second current, the current flowing in the transistor through the mirror circuit is increased to set the transistor to a conducting state, and when the second current is larger than the first current, the current flowing in the transistor through the mirror circuit is increased to set the transistor to a conducting state.

9 Claims, 9 Drawing Sheets

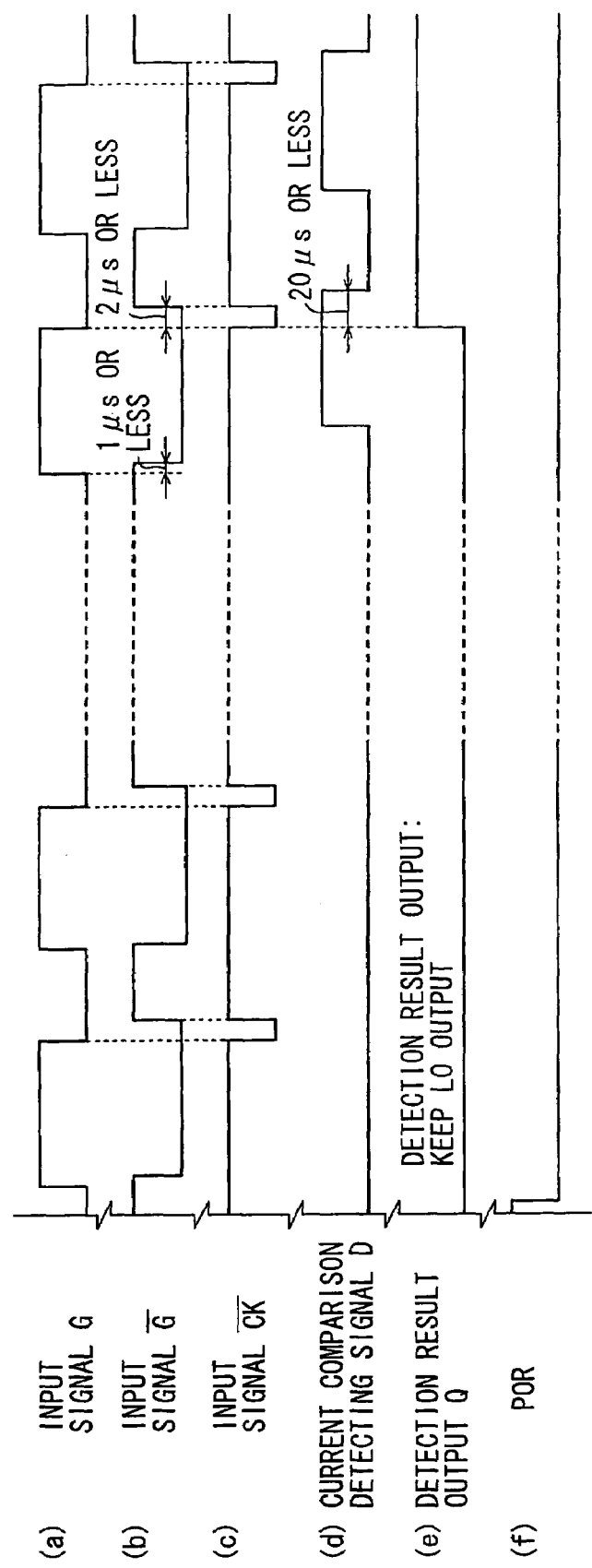

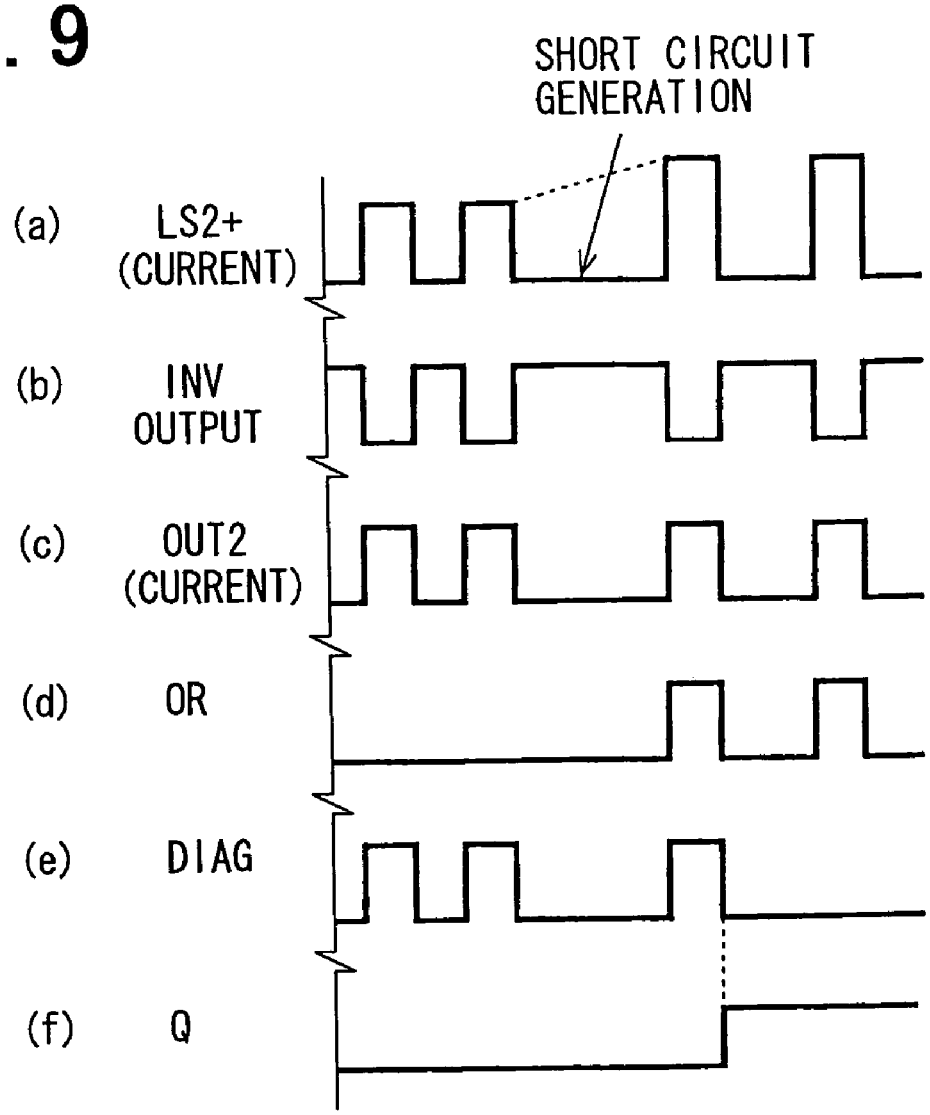

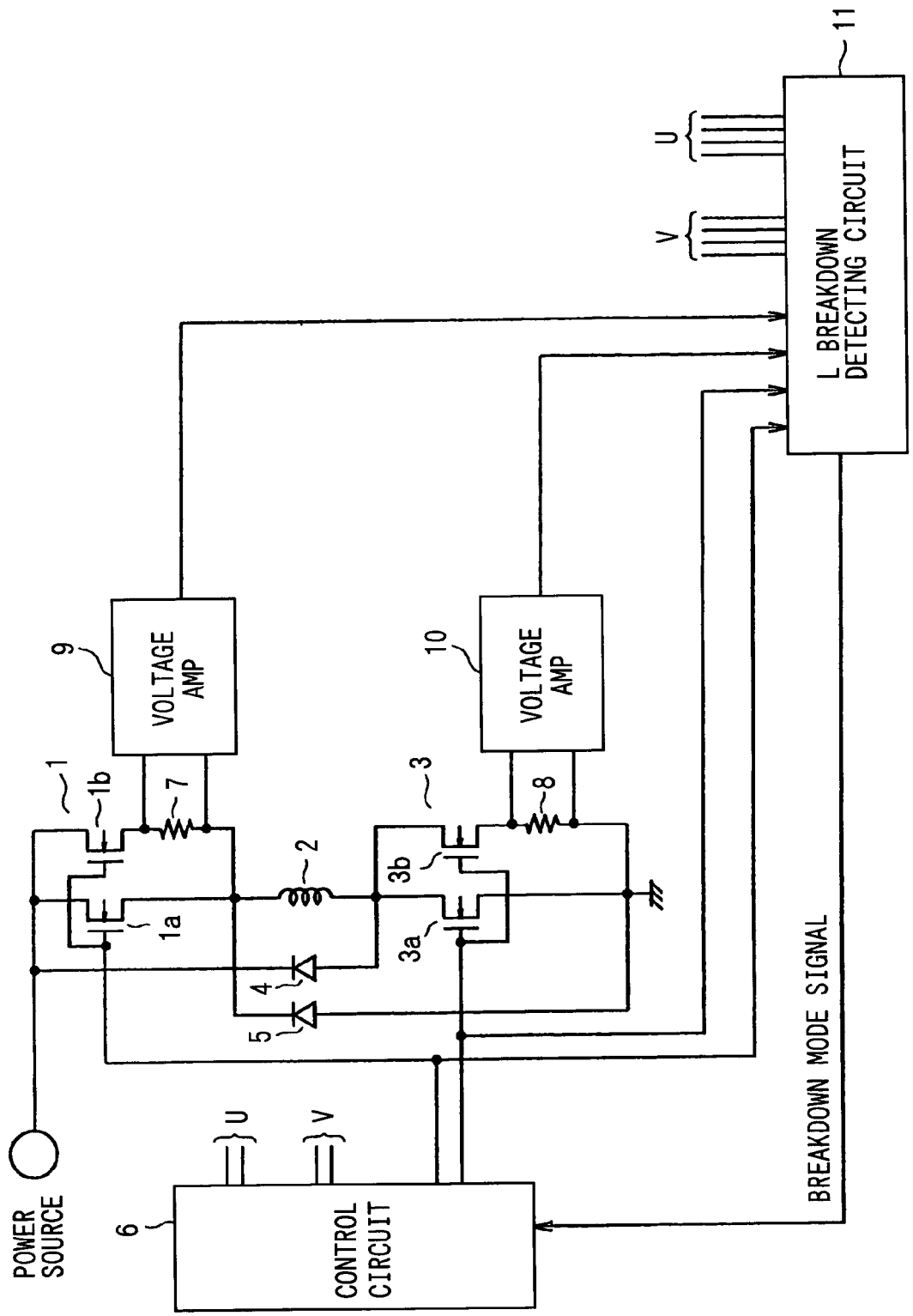

SHORT CIRCUIT DETECTING CIRCUIT AND ABNORMALITY MONITORING SIGNAL GENERATING CIRCUIT

CROSS REFERENCE TO RELATED APPLICATIONS

This application is based upon, claims the benefit of priority of, and incorporates by reference the contents of, Japanese Patent Application No. 2004-165787 filed on Jun. 3, 2004 and Japanese Patent Application. No.2005-36332 filed on Feb. 14, 2005.

FIELD OF THE INVENTION

The present invention relates to a circuit for detecting a short circuit state of a load in a construction having a power-source side transistor connected between a power source and the load and a ground side transistor connected between the load and the ground to drive the load by supplying current to the load, and an abnormality monitoring signal generating circuit for generating an abnormality monitoring signal whose output state is varied when a short circuit state is detected by the circuit for detecting the short circuit state.

BACKGROUND OF THE INVENTION

FIG. 10 shows an electrical construction of a breakdown detecting circuit for detecting a breakdown around a load in a driving circuit, which is disclosed in JP-A-2000-293201 (hereafter "Patent Document 1"). As a load is assumed a switched reluctance motor for driving a linear solenoid constituting the transmission of a vehicle, for example. The switched reluctance motor is disposed in a circuit for driving one-phase (W-phase) in a three-phase winding wire. A power-source side current mirror circuit 1, an L load 2 which is a winding wire of a motor and a ground-side current mirror circuit 3 are connected in series between the power source and the ground. The current mirror circuit 1 is constructed by two N-channel FETs 1a and 1b, and the current mirror circuit 3 is constructed by two N-channel FETs 3a and 3b.

An inverse-direction diode 4 is connected between the power source and the ground side terminal of the L load 2, and a diode 5 in the opposite is connected between the L load 2 and the power source side terminal. A control circuit 6 outputs gate signals to the FETs 1a, 1b of the current mirror circuit 1 and the FETs 3a, 3b of the current mirror circuit 3 to switch these FETs. The FETs are disposed at the power source side and the ground side to supply current to the L load as described above in consideration of fail safe when any one of the FETs is short-circuited.

Resistors 7 and 8 are connected between the source of the FET 1b and the L load 2 and between the source of FET 3b and the ground, and voltage amplifiers 9 and 10 are connected between both the respective ends of the resistors 7 an 8, respectively. The output signals of the voltage amplifiers 9 and 10 are supplied to an L breakdown detecting circuit 11, and the L breakdown detecting circuit 11 refers to and compares the output signals of the voltage amplifiers 9 and 10 at the output timings of the gate signals of the FETs 1a, 1b and the FETs 3a, 3b under the control of the control circuit 6 to detect a breakdown such as incomplete short-circuit occurring in the L load 2 or the like. Circuits having the same construction are disposed with respect to the other U, V phases.

However, in the technique disclosed in the patent document 1, current flowing in the L load 2 is converted to a voltage by the resistors 7 and 8, and thus a conversion error occurs. Furthermore, the terminal voltage of the resistor is reduced in a low current region, and thus there is a problem that dispersion is liable to occur in detection precision.

SUMMARY OF THE INVENTION

The present invention has been implemented in view of the foregoing situation, and has an object to provide a detecting circuit which can detect a short circuit state occurring in a load with high precision, and an abnormality monitoring signal generating circuit which can surely vary the output state of an abnormality monitoring signal when the short circuit state is detected.

In a short circuit detecting circuit according to a first aspect, first and second detecting transistors are disposed so as to form mirror pairs with power-source side and ground side transistors for driving a load. A first, second current mirror circuit is constructed by a pair of transistors for flowing currents corresponding to the mirrored current of a first current flowing in a first detecting transistor and the mirrored current of a second current flowing in a second detecting transistor, and the former current mirror circuit is set so that the current ratio of the first current side is large while the latter current mirror circuit is set so that the current ratio of the second current side is large.

A first judging transistor is connected to the first current side of the first current mirror circuit, and it is conducted when the first current is larger than the second current. A second judging transistor is connected to the second current side of the second current mirror circuit, and it is conducted when the second current is larger than the first current. That is, the first judging transistor is conducted when the current flowing at the power source side of the load is larger than the current flowing at the ground side, and the second judging transistor is conducted when the current flowing at the ground side of the load is larger than the current flowing at the power source side. Accordingly, whether the load falls into the short circuit state can be detected on the basis of the magnitude relationship between the currents flowing in the transistors constituting the mirror pair without converting the load current to the voltage unlike the prior art. Therefore, no error is interposed in the voltage conversion unlike the conventional construction, the detection can be performed with higher precision. The detection can be also performed with high precision in the low current region.

In a short circuit detecting circuit according to a second aspect, the detection of the short circuit state is carried out by the following action. Furthermore, in the following description, the main transistor constituting the current mirror circuit represents a transistor whose control terminal is connected to the output terminal thereof (for example, in the case of a bipolar transistor, the base thereof is connected to the collector thereof, and the assistant transistor represents a transistor paired with the main transistor.

If the first current and the second current have the same current ratio, the current flowing through the first and second assistant transistors of the third current mirror circuit is equal to the current flowing through the first and second assistant transistors of the fourth current mirror circuit. Accordingly, the same amount of current flows through the main and auxiliary transistors of the first and second current mirror circuits, however, the current amount concerned is regulated by the transistor having a smaller current ratio.

When the first current is slightly larger than the second current, in the first current mirror circuit, the large current larger than the current flowing in the main current flows in the assistant transistor whose current ratio is set to a large value. At this time, the first judging transistor is conducted by the increasing amount of the current, and thus occurrence of the short circuit state at the power source side of the load is detected.

Furthermore, when the second current is slightly larger than the first current, in the second current mirror circuit, the larger current than the current flowing in the main transistor flows in the assistant transistor whose current ratio is set to a large value. At this time, the second judging transistor is conducted by the increasing amount of the current, and thus occurrence of the short circuit state at the ground line of the load is detected.

In a short circuit detecting circuit according to a third aspect, the diodes are inserted in the forward direction to the control terminals of the transistors at the power source side and the ground side in connection with the construction that the main transistors of the third and fourth current mirror circuits are inserted at the ground side of the first and second detecting transistors, whereby the balance of the voltages applied to the control terminals of the transistors at the power source side and the ground side can be adjusted.

In a short circuit detecting circuit according to a fourth aspect, the construction of the first and second current mirror circuits is the same as that of the second aspect. However, the third current mirror circuit is different from the second aspect in that the common terminal is connected through the resistor to the ground. The fourth current mirror circuit is different in that the main transistor is connected to the power source side of the second detecting transistor. The first operational amplifier is connected so that feedback is applied to the inverting input terminal side thereof through the main transistor constituting the third current mirror circuit, whereby their input terminals are set to a virtual-short state. Accordingly, the ground side potentials of the power-source side transistor and the first detecting transistor are adjusted to be equal to each other, and the mirror currents of the current mirror circuits constructed by the power-source side transistor and the first detecting transistor are equal to each other.

Likewise, the second operational amplifier is also connected so that feedback is applied to the inverting input terminal thereof through the main transistor constituting the fifth current mirror circuit, whereby the adjustment is made so that the power source side potentials of the ground side transistor and the second detecting transistor are equal to each other and the mirror currents of the current mirror circuits constructed by both the transistors are equal to each other.

With respect to the detection action of the short circuit state, substantially the same as described with respect to the second aspect is applied to the power source side. With respect to the ground side, the same as described with respect to the second aspect is also applied except that when the second current is slightly larger than the first current, the larger current than the current flowing through the fifth and fourth current mirror circuits flows in the assistant transistor whose current ratio is set to a large value in the second current mirror circuit.

According to the short circuit detecting circuit of a fifth aspect, the first diode is inserted between the ground side of the first detecting transistor and the main transistor of the third current mirror circuit. That is, when current I flows through the first detecting transistor, a voltage drop VD (=RI) occurs in accordance with ON-resistance R of the transistor concerned. At this time, the potential V0 of the output terminal of the first operational amplifier is represented by V0=VB−VD−VF when the power supply voltage is represented by VB and the junction voltage of the main transistor of the third current mirror circuit is represented by VF, and the first operational amplifier is required to output the voltage V0. That is, when the current I is small, the first operational amplifier must output a high voltage V0.

Therefore, by connecting the first diode as described above, the output voltage level of the first operational amplifier can be reduced by the amount corresponding to the forward voltage, and it can be adjusted so as not to be saturated at the upper limit side. Furthermore, by increasing the output voltage range of the second operational amplifier to be larger than the ground side by the amount corresponding to the forward voltage, the second diode can be adjusted so that the output voltage is not saturated at the lower limit side.

According to a short circuit detecting circuit of a sixth aspect, an offset adjusting resistance element is inserted between the output terminal of the first, second operational amplifier and the power source, the ground, and by properly setting the resistance value of the resistance element, an offset which would occur in the voltage level of the output terminal of the first, second operational amplifier can be overcome on the basis of the variation of the load current.

According to an abnormality monitoring signal generating circuit of a seventh aspect, on the basis of the fact that the first or second judging transistor of the short circuit detecting circuit of any one of the first to sixth aspects, an abnormality monitoring signal whose output state is varied is generated. In this case, a predetermined delay time is applied to the logical addition of the voltage signals which vary in connection with the conduction of the first, second judging transistors, and then input to the latch circuit. At this time, the latch circuit carries out a latch operation in accordance with level variation of a signal synchronous with the output timing of a control signal for conducting any one of the power source side and ground side transistors. The signal latched by the latch circuit and a synchronous signal are subjected to logical product to generate and output the abnormality monitoring signal.

That is, the variation of the voltage signal occurring when the short circuit is detected occurs substantially in synchronism with the output timing of the control signal, and if the timing of the signal variation is slightly varied, the variation of the voltage signal can be surely captured at the time point when the level of the control signal varies at the rear end side. Accordingly, if the latch operation is carried out with the level variation of the signal synchronous with the control signal as a trigger, the state that the voltage signal varies can be held. By varying the output state of the abnormality monitoring signal on the basis of the hold of the above state, the detection of the short circuit can be surely reflected.

The "logical addition", "logical product" described here and below are applied irrespective of positive or negative of logic regarding the input/output signals.

According to an abnormality monitoring signal generating circuit of an eighth aspect, the latch circuit is constructed by a bipolar transistor logic. That is, when the short circuit detecting circuit is constructed by a bipolar process, it is preferable that the abnormality monitoring signal generating circuit is constructed by the same process. In this case, in order to perform the latch operation more surely, it is desirable to use an edge trigger type D latch. However, the edge trigger type D latch is normally constructed by CMOS logic, and only a level trigger D latch can be constructed by the bipolar transistor logic.

Therefore, if the synchronous signal and the inversion of the signal level thereof are subjected to logical product, a period for which both the signal levels thereof are equal to each other is slightly generated in accordance with the delay time difference applied at the inverting circuit side, so that the logical product signal becomes "true" for only the slight period. Accordingly, by carrying out the latch operation with the level of the signal as a trigger, a pseudo edge trigger operation can be implemented.

According to an abnormality monitoring signal generating circuit of a ninth aspect, an odd number of three or more of inverter gates are connected to one another in series to construct the abnormality monitoring signal generating circuit. The operation speed of the transistor constituting the inverter gate disposed at the last stage is set to be lower than the operation speed of the other transistors. In this construction, due to the difference in operation speed between the transistors, the gate delay time applied when the signal level is inverted from low to high is longer than the gate delay time applied when the signal level is inverted from high to low. Accordingly, when it is needed to apply some degree of delay time to generate a one-shot pulse having a predetermined width for triggering the D latch at the signal variation time point of the rear end side of the control signal or the synchronous signal, the connection stage number of the inverter gates can be reduced.

BRIEF DESCRIPTION OF THE DRAWINGS

The above and other objects, features and advantages of the present invention will become more apparent from the following detailed description made with reference to the accompanying drawings. In the drawings:

FIG. 8 is a timing chart showing the operation of the latch circuit;

FIG. 9 is a corresponding diagram to FIG. 4; and

FIG. 10 shows a prior art device.

DETAILED DESCRIPTION OF THE PREFERRED EMBODIMENTS

An embodiment of the present invention is explained by referring to diagrams. It is to be noted, however, that the present invention is by no means limited to this embodiment. In addition, the technological concept of the present invention can of course be implemented by using other commonly known technologies.

(First Embodiment)

Figure 3:
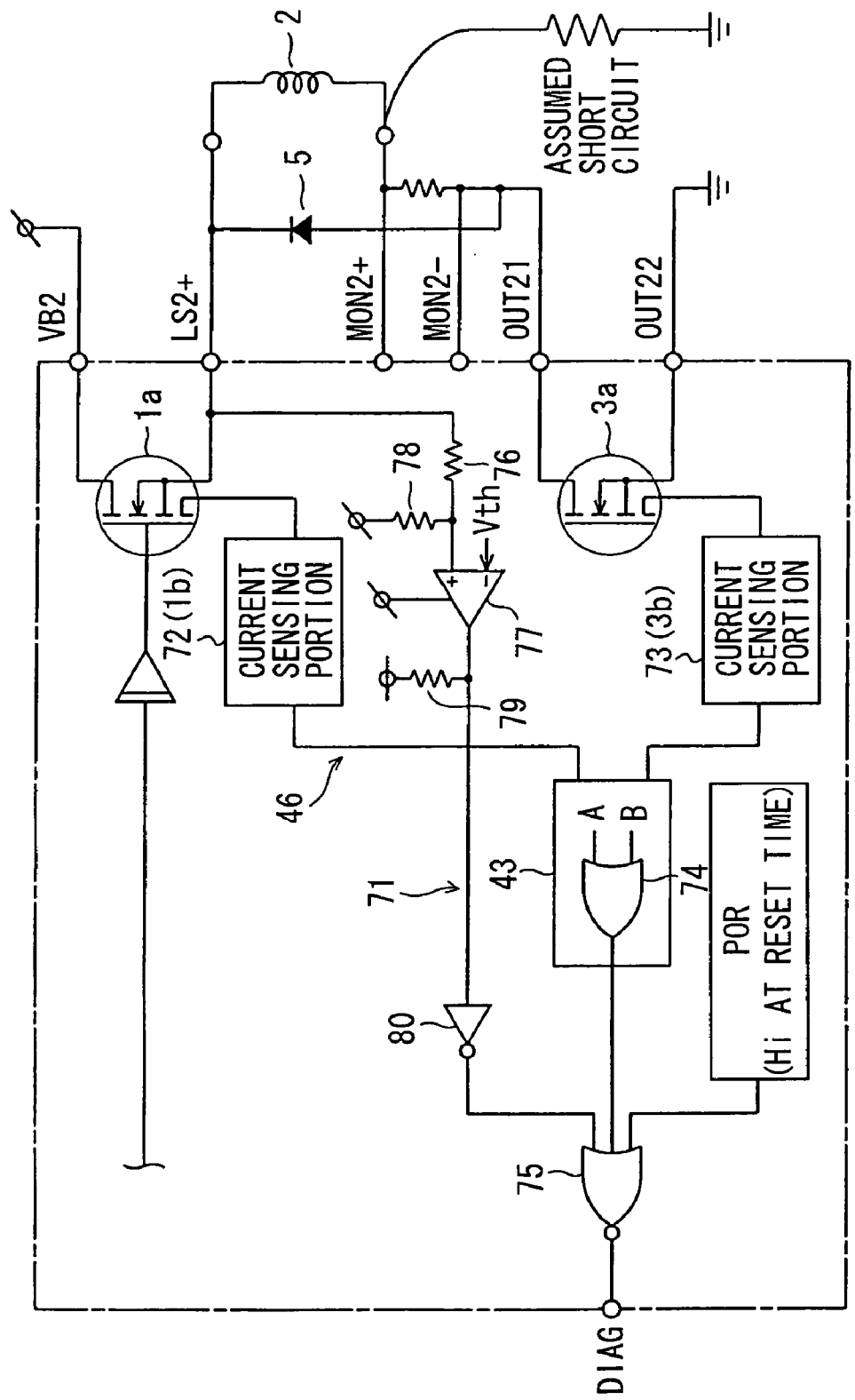
FIG. 3 shows a third embodiment, and is a diagram showing a main part of FIG. 1 in the first embodiment and an abnormality monitoring signal generating circuit.

A first embodiment of the present invention will be described hereunder with reference to FIG. 1. The same parts as FIG. 3 are represented by the same reference numerals, and the description thereof is omitted. Only the different portion will be described hereunder. The collectors of four PNP transistors 22a, 22b, 23a, 23b are connected to a power supply line 21, and respective pairs constitute current mirror circuits 22 and 23 (first current mirror circuit, second current mirror circuit), respectively.

The bases of the transistors 22a (main transistor), 22b (assistant transistor) are commonly connected to each other, and also connected to the power supply line 21 through a resistance element 24. Furthermore, they are connected to through a resistance element 25 to the emitter of a PNP transistor 26. The base of the transistor 26 is connected to the collector of the transistor 22b, and the collector of the transistor 26 is connected to a ground line 27. The emitter of the PNP transistor 28 (first judging transistor) is connected to the power supply line 21, the base of the PNP transistor 28 is connected to the collector of the transistor 22a, and the collector of the PNP transistor 28 is connected to the ground line 27 through resistance elements 29 and 30.

The emitter area ratio of the transistors 22a, 22b is set to 10:9 (for example, they are equivalent to the construction that ten transistors are connected to one another in parallel and the construction that nine transistors are connected to one another in parallel, respectively). Describing in detail later, when the mirror current flowing in the mirror circuit 22 is regulated by the transistor 22b having a smaller emitter area ratio, the transistor 28 is set so as not to be conducted.

Furthermore, resistance elements 31 and 32, PNP transistors 33 and 34 and resistance elements 35 and 36 are disposed at the current mirror circuit 23 side so as to be symmetric with the resistance elements 24 and 25, the PNP transistors 26 and 28 and the resistance elements 29 and 30, respectively. The emitter area ratio of the transistors 23a, 23b is set to 9:10. As in the case of the mirror circuit 22, when the mirror current flowing in the mirror circuit 23 is regulated by the transistor 23b having a smaller emitter area ratio, the transistor 34 (second judging transistor) is set so as not to be conducted.

A current mirror circuit 37 (third current mirror circuit) constructed by three NPN transistors 37a, 37b and 37c is disposed at the ground side (source side) of FET 1b (first detecting transistor). That is, the bases of the three transistors 37a, 37b and 37c are commonly connected to the collector of the transistor 37a (main transistor). The collector of the transistor 37a is connected to the source of FET 1b, and the collector of the transistor 37b (first assistant transistor) is connected to the collector of the transistor 22a through a resistance element 38. The collector of a transistor 37c (second assistant transistor) is connected to the collector of the transistor 23a through a resistance element 39. The emitters of the transistors 37a, 37b, 37c are commonly connected to the source of FET 1a.

Furthermore, a current mirror circuit 40 (fourth current mirror circuit) constructed by three NPN transistors 40a, 40b and 40c is disposed at the ground side (source side) of FET 3b (second detecting transistor). That is, the bases of the three transistors 40a, 40b, 40c are commonly connected to the collector of the transistor 40a (main transistor). The collector of the transistor 40a is connected to the source of FET 3b, and the collector of the transistor 40b (first assistant transistor) is connected to the collector of the transistor 22b through a resistance element 41. The collector of a transistor 40c (second assistant transistor) is collected to the collector of the transistor 23b through a resistance element 42. The emitters of the transistors 40a, 40b, 40c are commonly connected to the ground line 37.

The two input terminals of an L breakdown detecting circuit 43 replacing the L breakdown detecting circuit 11 are connected to a common connection point of the resistance elements 29 and 30 and a common connection point of the resistance elements 35 and 36, respectively. The L breakdown detecting circuit 43 detects a short circuit state occurring at the power-source side of the L load 2, the ground side due to potential variation at each common connection point.

The L breakdown detecting circuit 43 outputs a breakdown mode signal to the control circuit 6 when the short circuit state is detected. When detecting that the breakdown mode signal is output, the control circuit 6 turns off the FETs 1a and 1b, 3a and 3b to stop the driving of the load 2. Forward-direction diodes 44 and 45 are connected between the output terminal of the control circuit 6 and the gate of FET 1a (power-source side transistor) and between the output terminal of the control circuit 6 and the gate of FET 3a (ground side transistor), respectively. The above elements constitute the short circuit detecting circuit 46.

In the above construction, the transistors 26 and 33 are disposed for correcting the base current so that the mirror ratio (based on the emitter area ratio) in the current mirror circuits 22 and 23 is approached to an ideal value.

Next, the action of this embodiment will be described. When the circuit operation is normal, the amounts of currents flowing in FETs 1a, 3a at the power source side and ground side of the L load 2 are equal to each other, and thus the amounts of currents (first and second currents) flowing in FETs 1b, 3b which mirror the above currents are equal to each other. The same amount of current flows into the transistors 22a and 22b constituting the current mirror circuit 22 through the transistor 37b of the current mirror circuit 37 and the transistor 40b of the current mirror circuit 40. Furthermore, the same amount of current also flows into the transistors 23a and 23b constituting the current mirror circuit 23 through the transistor 37c of the current mirror circuit 37 and the transistor 40c of the current mirror circuit 40.

At this time, the same amount of mirror current flowing in the current mirror circuits 22 and 23 is regulated by the transistors 22b and 23b whose emitter area ratios are set to be smaller, and thus the transistors 28 and 34 are not conducted. Accordingly, the input terminal levels of the L breakdown detecting circuit 43 are set to low level.

It is assumed that the current flowing in the power source side of the L load 2 due to occurrence of a short circuit state increases to be larger than the current flowing at the ground side, and thus the increase rate exceeds 10%. In this case, the mirror current flowing in the current mirror circuit 37 also increases over 10%, and thus a large current which is over 10% with respect to the transistor 22b side flows in the transistor 22a whose current ratio is set to a large value in the current mirror circuit 22. At this time, the transistor 28 is conducted by the increase of the current, so that current flows in the resistance elements 29 and 30 and only the input terminal level corresponding to the L breakdown detecting circuit 43 varies to high level. Accordingly, the L breakdown detecting circuit 43 can detect occurrence of a short circuit state at the power source side of the L load 2.

Furthermore, it is assumed that the current flowing to the ground side of the L load 2 due to occurrence of the short circuit state increases to a value larger than the current flowing to the power source side and the increasing rate is over 10%. In this case, the mirror current flowing in the current mirror circuit 40 increases over 10%, and thus a large current which is over 10% with respect to the transistor 23a side flows in the transistor 23b whose current ratio is set to a large value in the current mirror circuit 23. At this time, the transistor 34 is conducted by the increase of the current, so that current flows in the resistance elements 35 and 36 and only the input terminal level corresponding to the L breakdown detecting circuit 43 varies to high level. Accordingly, the L breakdown detecting circuit 43 can detect occurrence of a short circuit state at the ground side of the L load 2.

As described above, according to this embodiment, in order to drive the L load 2, FETs 1b and 3b are disposed so as to form mirror pairs with FETs 1a and 3a disposed at the power source side and the ground side respectively, and the current mirror circuits 22 and 23 are designed so that the currents corresponding to the mirrored currents of the first and second currents flowing in FETs 1b and 3b flow therethrough. In the former current mirror circuit, the emitter area ratio of the transistors 22a and 22b is set so that the current ratio at the first current side is large, and in the latter current mirror circuit, the emitter area ratio of the transistors 23a and 23b is set so that the current ratio at the second current side is large.

When the first current is larger than the second current by an increasing rate more than 10%, the current flowing through the current mirror circuit 37 in the transistor 22a is increased so that the transistor 28 is made to be conducted. When the second current is larger than the first current by an increasing rate more than 10%, the current flowing through the current mirror circuit 40 in the transistor 23b is increased so that the transistor 34 is made to be conducted. Accordingly, it can be detected on the basis of the magnitude relation between the currents flowing in the transistors constituting the mirror pair without converting a load current to a voltage that the load 2 falls into a short circuit state unlike the construction of the prior art. Accordingly, the detection can be performed with higher precision. Furthermore, the detection can be also performed in a low current region with high precision.

In connection with the construction that the transistors 37a and 40a are inserted at the ground side of FETs 1b and 3b, diodes 44 and 45 are inserted in forward direction at the gates of FETs 1a and 3a, so that the balance of the voltage applied to each gate can be adjusted by a forward voltage VF.

In addition, in the short circuit detecting circuit 46, the transistors constituting the current mirror circuits 22 and 23 are driven by the drain-source voltage (dependent on ON-resistance) of FET 1a, 3a, so that relatively large currents can be made to flow into the current mirror circuits 22 and 23. Therefore, even when the load current is relatively large, the short circuit detection can be performed.

(Second Embodiment)

Figure 2:
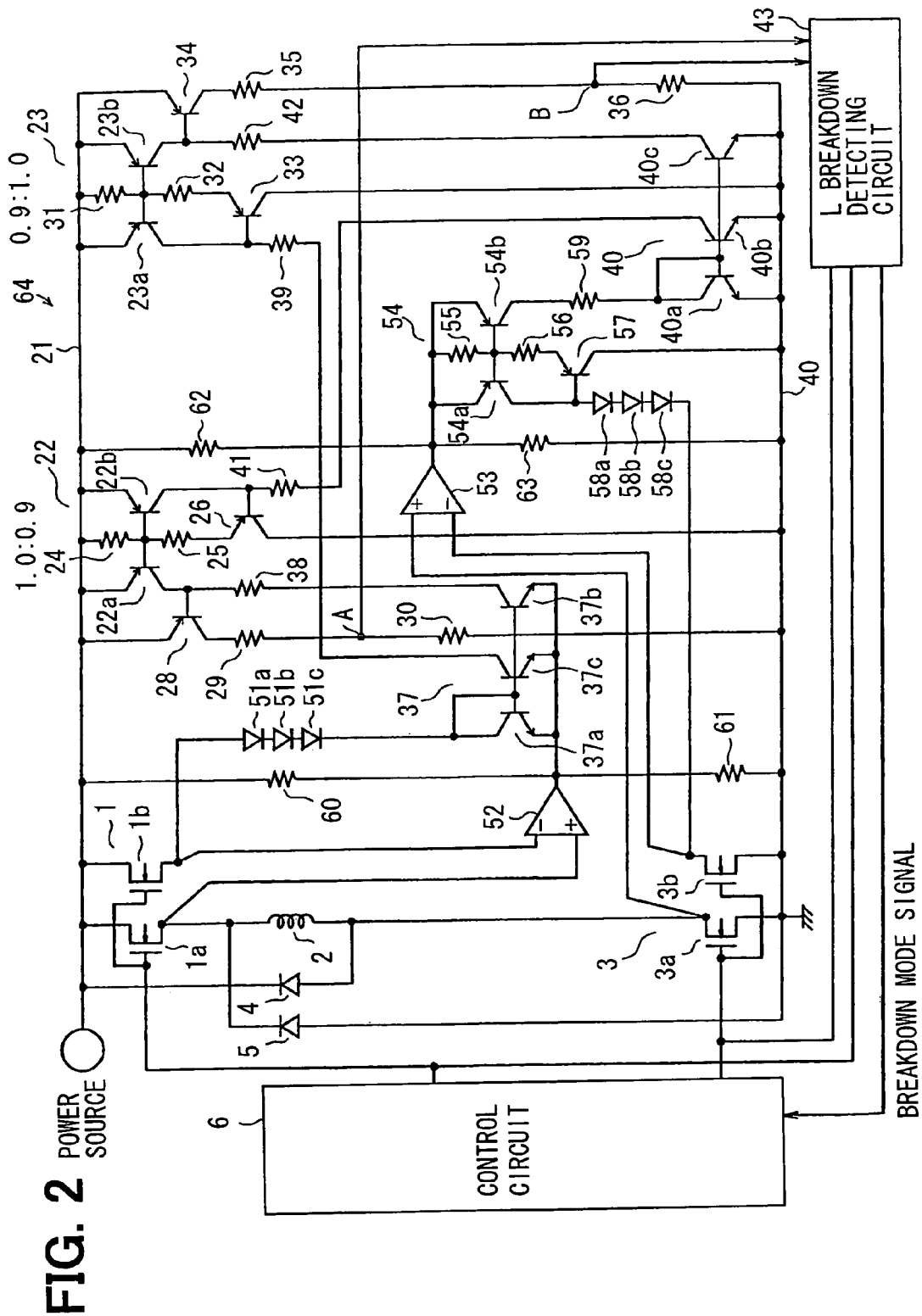
FIG. 2 shows a second embodiment and corresponds to FIG. 1.

FIG. 2 shows a second embodiment of the present invention. The same parts as the first embodiment are represented by the same reference numerals and the description thereof is omitted. Only the different portions will be described. A series circuit of three diodes 51a to 51c (first diodes) is inserted between the source of FET 1b and the collector of the transistor 37a. The sources of FETs 1a and 1b are connected to the non-inverting input terminal and inverting input terminal of an operational amplifier 52 (first operational amplifier), and the output terminal of the operational amplifier 52 is connected to the emitter side of the current mirror circuit 37.

At the current mirror circuit 3 side, the source of FET 3b is directly connected to the ground line 27. The drains of FETs 3a and 3b are connected to the non-inverting input terminal and inverting input terminals of an operational amplifier 53 (second operational amplifier), and the output terminal of the operational amplifier 53 is connected to the emitter side of the current mirror circuit 54 (fifth current mirror circuit). The bases of the transistors 54a and 54b are commonly connected to each other, and they are also connected to the output terminal of the operational amplifier 53 through a resistance element 55, and connected to the emitter of a PNP transistor 57 through a resistance element 56. The base of the transistor 57 is connected to the collector of the transistor 54a, and the collector is connected to the ground line 27.

The collector of the transistor 54a is connected to the drain of FET 3b through a series circuit comprising three diodes 58a to 58c (second diodes). The collector of the transistor 54b is connected to the collector of the transistor 40a constituting the current mirror circuit 40 through a resistance element 59.

Furthermore, the output terminal of the operational amplifier 52 is connected through resistance elements 60 and 61 to the power supply line 21 and the ground line 27 respectively, and the output terminal of the operational amplifier 53 is connected through resistance elements 62 and 63 to the power supply line 21 and the ground line 27, respectively. The diodes 44 and 45 are deleted. The above elements constitute a short circuit detecting circuit 64.

Next, the action of the second embodiment will be described. The detecting operation of the short circuit state is basically the same as the short circuit detecting circuit 46 of the first embodiment. In the second embodiment, the operational amplifiers 52 and 53 are connected to each other so that the outputs thereof are fed back through the transistor 37a and the transistor 54a to the inverting input terminal sides thereof, respectively. That is, the operational amplifiers 52 and 53 are set to virtual short, and the source potential difference of FETs 1a and 1b and the drain potential of the FETs 3a, 3b are adjusted to be equal to each other. Accordingly, the operational amplifiers 52 and 53 act to adjust the mirror current error in the current mirror circuits 1, 3 constructed by FETs 1a and 1b and FETs 3a and 3b so that the mirror current error in the current mirror circuits 1, 3 are more reduced.

Furthermore, the three diodes 51a to 51c have the following action. That is, when current IU flows through FET 1b, a voltage drop VDU (=RIU) occurs in accordance with ON-resistance R of FET 1b. At this time, when the power source voltage is represented by VB and the base-emitter voltage in the transistor 37a is represented by VF and it is assumed that no diode 51a to 51c exists, the potential VOU of the output terminal of the operational amplifier 52 is represented as follows.

$$VOU=VB-VDU-VF$$

Therefore, the operational amplifier 52 is required to output the voltage VOU. That is, when the current I is small, the operational amplifier 5.2 must output a higher voltage VOU.

Therefore, if the diodes 51a to 51 are inserted between the source of FET 1b and the collector of the transistor 37a, the output voltage level of the operational amplifier 52 can be reduced by the amount corresponding to the forward voltage 3VF. Accordingly, the output voltage of the operational amplifier 52 is adjusted so as not to be saturated at the upper limit side.

The diodes 58a to 58c have the same action as the lower limit side of the output voltage range in the operational amplifier 53. That is, when current ID flows through FET 3b, a voltage drop VDD occurs in accordance with ON-resistance of FET 3b. Therefore, when the emitter-collector voltage in the transistor 54a is represented by VCE and it is assumed that no diode 53a to 53c exists, the potential VOD of the output terminal of the operational amplifier 53 is represented as follows.

$$VOD=VDD+VCE$$

Therefore, the operational amplifier 53 is required to output the voltage VOD. That is, when the current ID is small, the operational amplifier 53 must output a lower voltage VOD.

Therefore, if the diodes 58a to 58c are inserted between the drain of FET 3b and the collector of the transistor 54a, the output voltage level of the operational amplifier 53 can be increased by only the amount corresponding to the forward voltage 3VF. Accordingly, the output voltage of the operational amplifier 53 is adjusted so as not to be saturated at the lower limit side.

Furthermore, the resistance elements 60 and 61 and the resistance elements 62 and 63 are disposed so as to compensate for the offsets occurring in the voltage levels of the output terminals of the operational amplifiers 52, 53 on the basis of variation of load current by properly setting the resistance values of the resistance elements 60 and 61 and the resistance elements 62 and 63.

As described above, according to the second embodiment, the sources of FETs 1a and 1b are connected to the non-inverting input terminal and the inverting terminal of the operational amplifier 52, and the output terminal of the operational amplifier 52 is connected to the emitter side of the current mirror circuit 37. At the current mirror circuit 3 side, the source of FET 3b is directly connected to the ground line 27, the drains of FETs 3a and 3b are connected to the non-inverting input terminal and inverting input terminal of the operational amplifier 53, and the output terminal of the operational amplifier 53 is connected to the emitter side of the current mirror circuit 54. Accordingly, the source potential of FET 1a, 1b is equal to the drain potential of FET 3a, 3b, and the mirror currents of the current mirror circuits 1 and 3 constructed by these FETs are equal to each other, so that the detection precision of the short circuit state can be enhanced.

The three diodes 51a to 51c are inserted between the source of FET 1b and the collector of the transistor 37a, and the three diodes 58a to 58c are inserted between the collector of the transistor 54a and the drain of FET 3b. Accordingly, the output voltage ranges of the operational amplifiers 52 and 53 are adjusted so that they do not exceed their limits. Furthermore, the resistance elements 60 and 61 and the resistance elements 62 and 63 are disposed in parallel between the output of the operational amplifier 52, 53 and the power supply line 21 and between the output of the operational amplifier 52, 53 and the ground line 27. Therefore, an adjustment can be made on the basis of variation of the load current so that an offset occurring in voltage level of the output terminal of each of the operational amplifiers 52 and 53 is overcome.

(Third Embodiment)

FIGS. 3 to 9 show a third embodiment. In the third embodiment, when a short circuit state is detected by the short circuit detecting circuit 46 or 64 in the first or second embodiment, there is provided an abnormality monitoring signal generating circuit for varying the output state of a signal DIAG in accordance with the abnormality detection described above. FIG. 3 shows a main part of FIG. 1 in the first embodiment and an abnormality monitoring signal generating circuit 71. Current sense portions 72 and 73 correspond to FETs 1b and 3b in FIG. 1.

Figure 1:
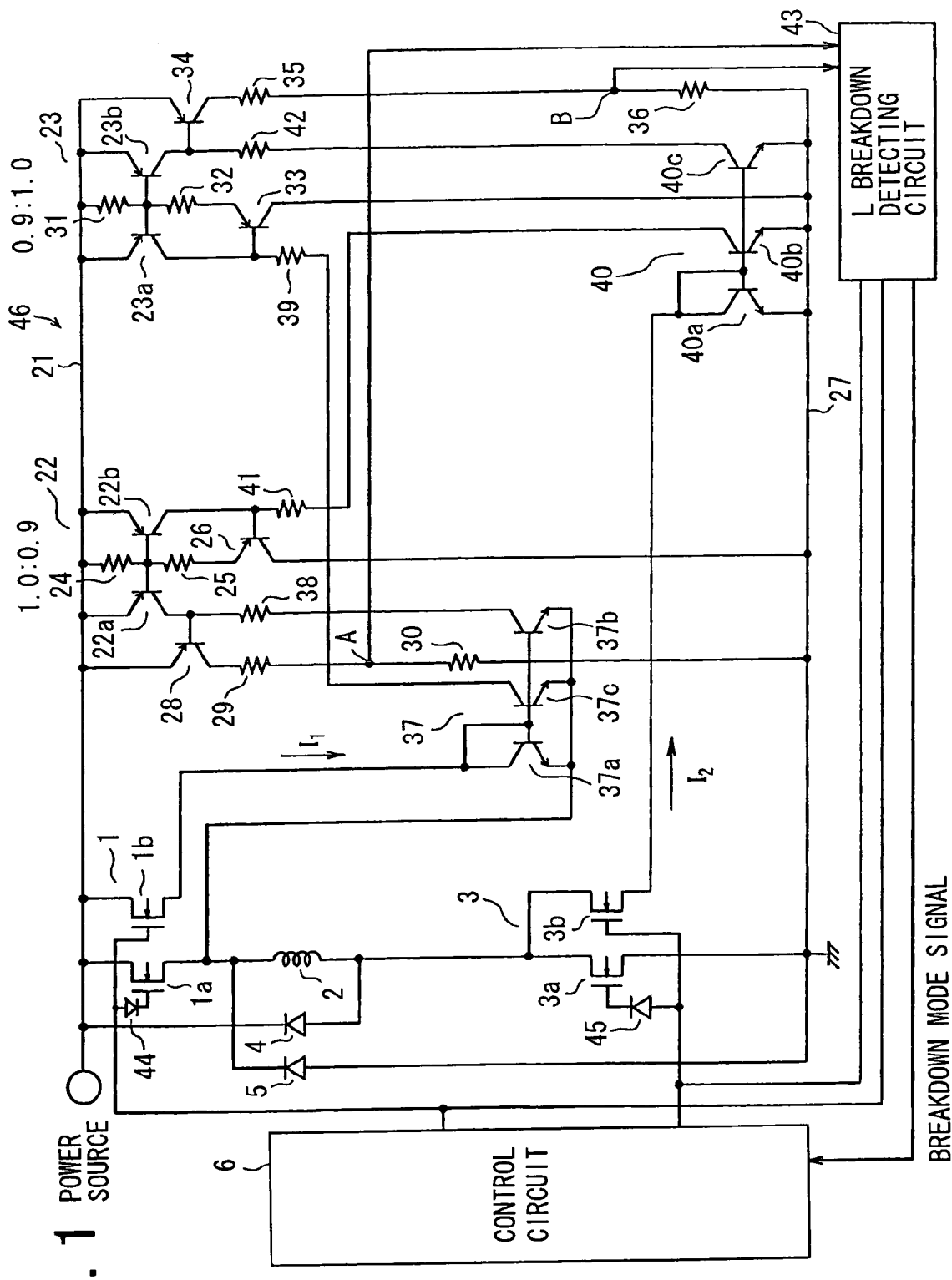
FIG. 1 shows a first embodiment and is a diagram showing an electrical construction of a short circuit detecting circuit.

The A point and the B point shown in FIG. 1, that is, the common connection points between the resistors 29 and 30 and the resistors 35 and 36 are connected to input terminals of an OR gate (logical addition gate) 74, and the output terminal of the OR gate 74 is connected to an input terminal of a three-input NOR gate (AND of negative logical input, logical product gate) 75. The drain of FET 1a is connected to the non-inverting input terminal of the comparator 77 through a resistor 76. A threshold value voltage Vth is applied to the inverting input terminal of the comparator 77, and the non-inverting input terminal and the output terminal are pulled up to the power source through resistors 78 and 79.

The output terminal of the comparator 77 is connected to an input terminal of an NOR gate 75 through an inverter gate 80, and a high-active power-on reset signal POR is applied to the remaining input terminals of the NOR gate 75. The NOR gate 75 outputs an abnormality monitoring signal DIAG.

Figure 4:
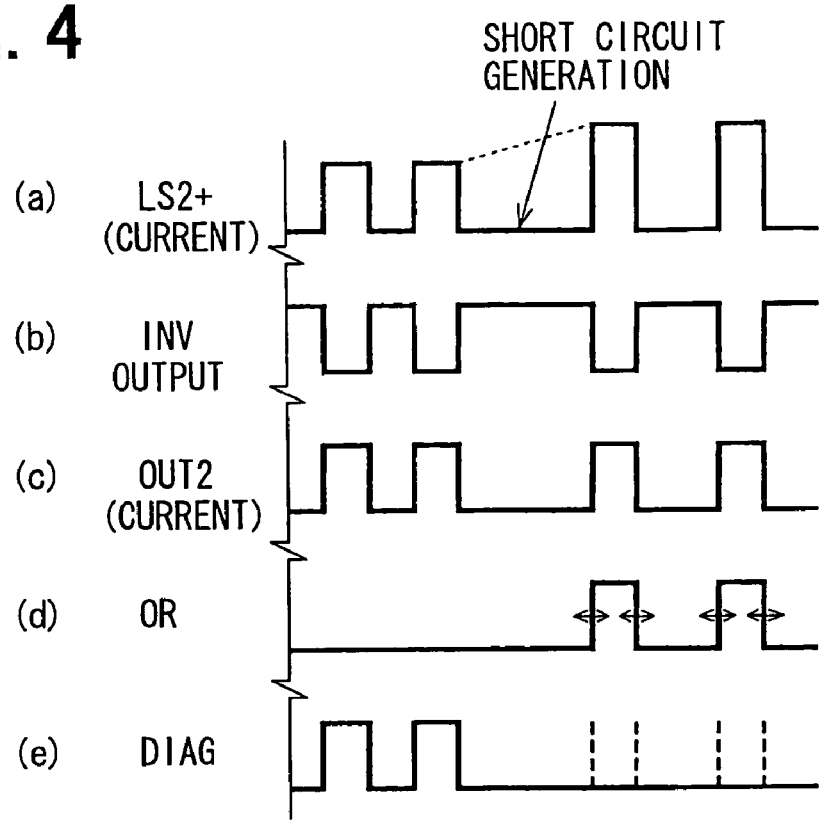
FIG. 4 is a timing chart showing the circuit operation of the abnormality monitoring signal generating circuit.

FIG. 4 shows a timing chart showing the circuit operation of the abnormality monitoring signal generating circuit 71. (a) LS2+ represents the waveform of current flowing to the power source side of the coil 2, (b) INV output represents the waveform of an output signal of the inverter gate 80, and (c) OUT2 represents the waveform of current flowing to the ground side of the coil 2. When current is supplied to the coil 2, FET 3a is set to ON-state at all times and the FET 1a side is controlled to be interrupted. Accordingly, the level of the non-inverting input terminal of a comparator 77 is low while no current flows in the coil 2. However, it increases and exceeds the threshold value Vth when current flows in the coil 2, and the comparator 77 outputs high level. As a result, (b) INV output is set to a low level in synchronism with the period when current flows in the coil 2 (synchronous signal).

The potential at each of the A point and the B point is set to a low level when no short circuit occurs, and when short circuit occurs at any one of the power source side and the ground side, the potential concerned is set to high level in accordance with the period when current flows in the coil 2 as shown in (d). That is, as shown in (e), the abnormality monitoring signal DIAG corresponding to the output signal of the NOR gate 75 is intermittently set to high level in accordance with the INV output of (b) when no short circuit occurs, and thus it becomes a signal whose output state varies in accordance with the conducting timing of the power source side FET 1a.

When short circuit occurs (in this case, a case where it occurs at the ground side is assumed), the output of the OR gate 74 is set to high level in synchronism with the timing at which the INV output of (b) is set to low level, so that DIAG continues to keep the low level and the output pattern varies. On the basis of the variation of this state, abnormality is detected.

However, the signal processing system described above has the following problem. The abnormality monitoring signal DIAG is set to low level when short circuit occurs under the condition that the output of the OR gate 74 is set to high level in synchronism with the timing at which the INV output of (b) is set to low level as described above. However, actually, there is a case where both the timings are not necessarily completely coincident with each other due to the difference in circuit time constant or the time difference in gate delay. In this case, as shown in FIG. 4(e), the abnormality monitoring signal DIAG is set to high level for only a slight time before and after an edge of signal variation.

In order to solve such a problem, there has been hitherto taken such a countermeasure that a signal variation component which is output like a noise can be removed by adding a filter to the output terminal of the NOR gate 75 or the like. However, such a countermeasure may remove signal components of the abnormality monitoring signal DIAG itself if the time constant of the filter is set to an excessively large value, and it can be hardly said that it is a sufficient countermeasure.

Figure 5:
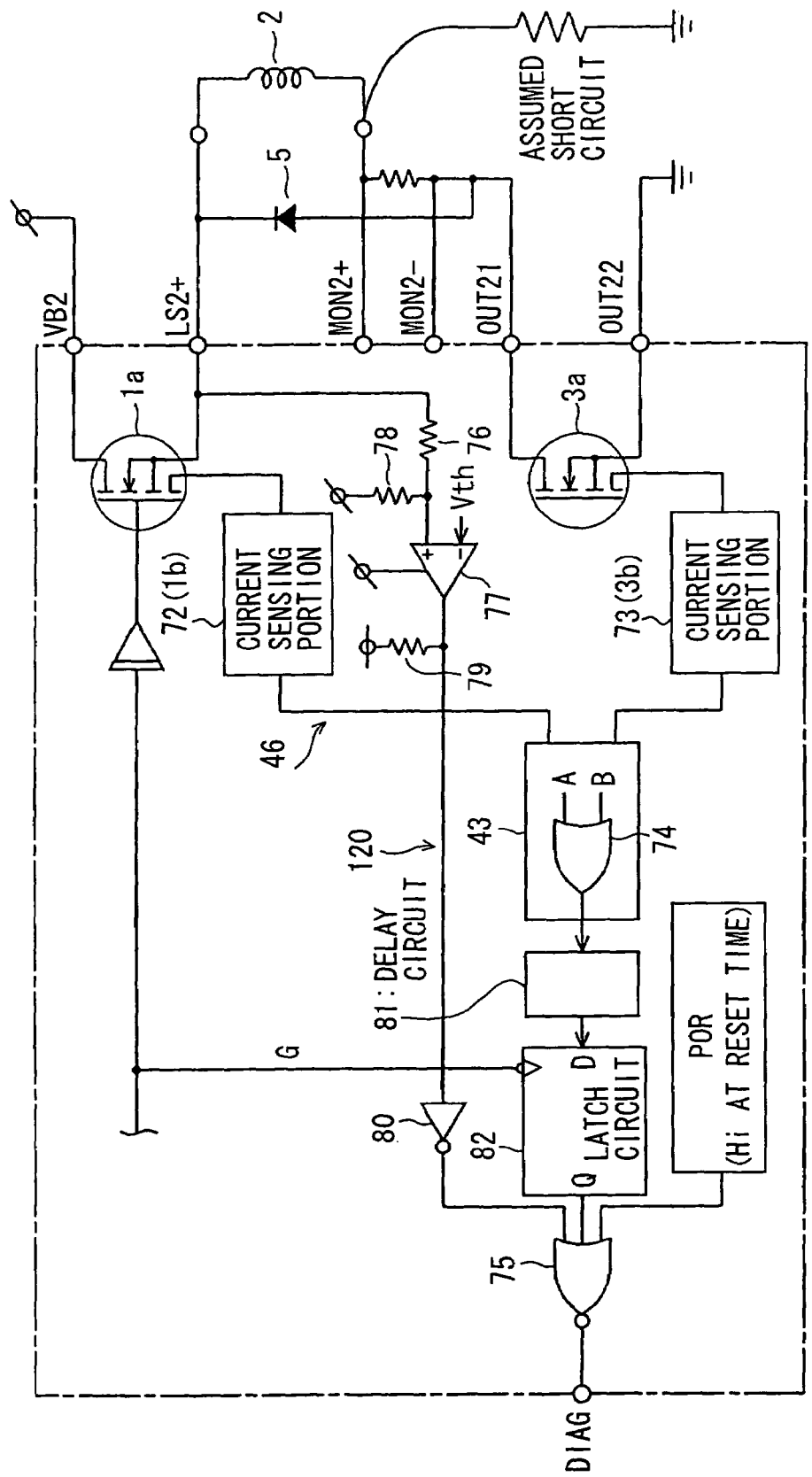
FIG. 5 is a diagram showing an abnormality monitoring signal generating circuit achieved by improving the construction of FIG. 3.

Therefore, in a third embodiment, as shown in FIG. 5, a delay circuit 81 (for example, delay time 20 microseconds) and a latch circuit 82 which carries out a pseudo latch operation based on edge trigger are inserted between the output terminal of the OR gate 74 and the NOR gate 75, and constitute an abnormality monitoring signal generating circuit 120. The short circuit detecting circuit 46 is constructed by a bipolar process except for FETs 1 and 3, and thus the latch circuit 82 is also constructed by the bipolar process. Therefore, the latch circuit 82 is constructed to carry out a pseudo edge trigger operation.

Figure 6:
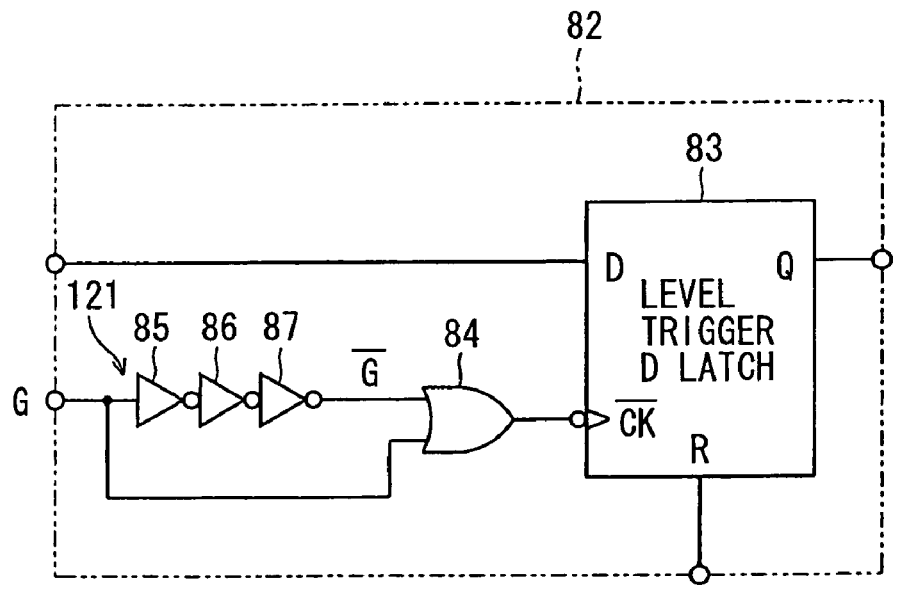
FIG. 6 is a diagram showing the construction of a latch circuit.

That is, as shown in FIG. 6, in the latch circuit 82, the output terminal of an OR gate (negative logical AND, logical product gate) 84 is connected to the trigger input (negative logical) CK of a D latch 83 of level trigger which is normally constructed by a bipolar transistor logic, a gate control signal G of FET 1a (synchronous signal) is applied to one of input terminals of the OR gate 84, and the inverted signal of a gate control signal G is applied to the other input terminal. This inversion is carried out while applying a predetermined delay time through three-stage inverter gates 85, 86 and 87. These parts constitute an inverting circuit 121.

Figure 7:
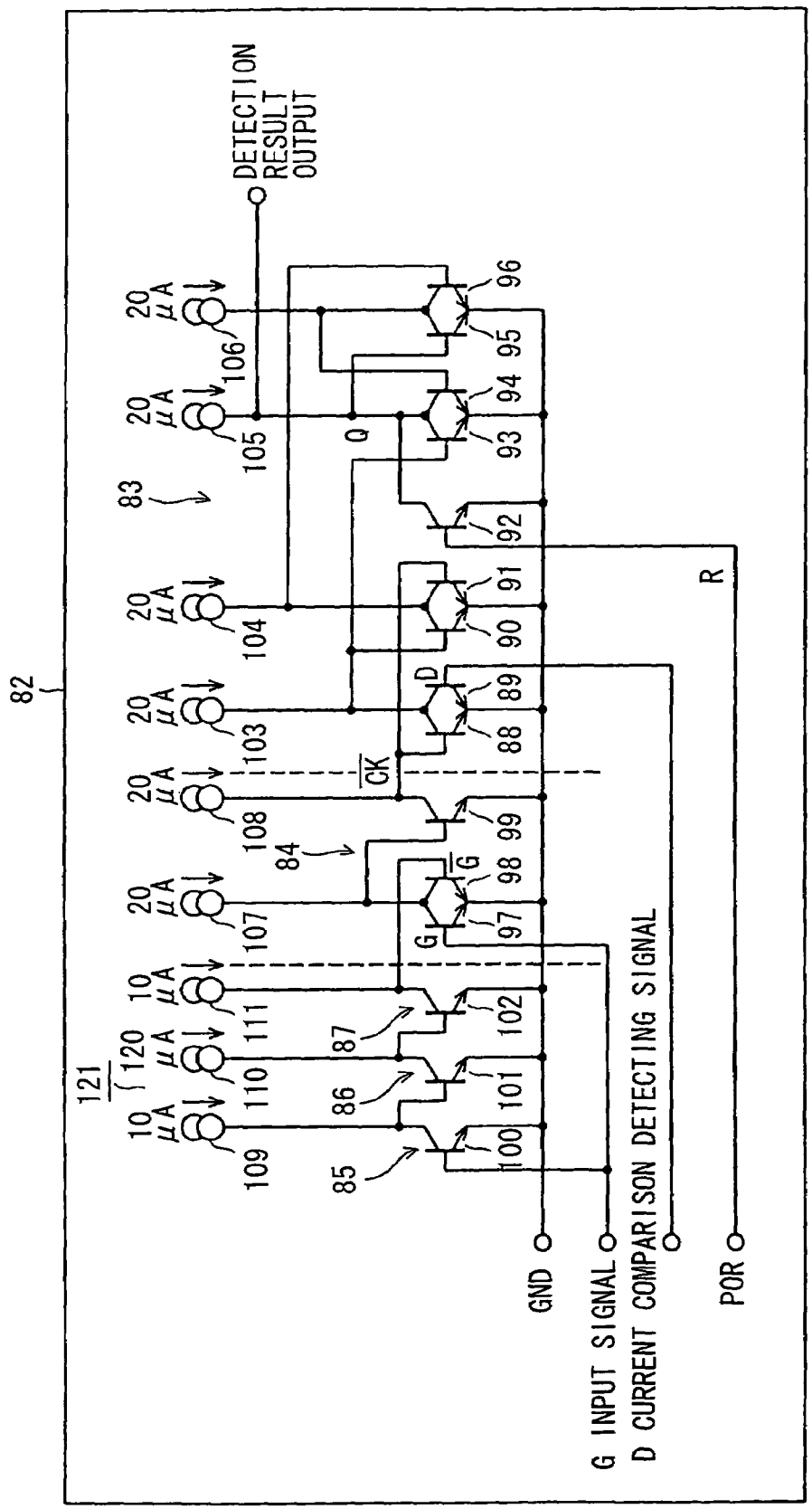
FIG. 7 is a diagram showing the construction of the latch circuit in terms of transistor level.

Furthermore, FIG. 7 shows the construction of the latch circuit 82 in terms of the transistor level. That is, the D latch 83 is constructed by NPN transistors 88 to 96, the OR gate 84 is constructed by NPN transistors 97 to 99, and the inverter gates 85 to 87 are constructed by NPN transistors 100 to 102. All the emitters of these transistors are connected to the ground.

In the D latch 83, the collectors of the respective pairs of the transistors 88 and 89, 90 and 91, 93 and 94, and 95 and 96 are commonly connected to one another, and constant current circuits 103 to 106 of 20 microamperes are connected to one another every pair. The collector of the transistor 92 is connected to the collectors of the transistors 93 and 94. The base of the transistor 88 is a negative logical trigger input terminal CK, and it is connected to the base of the transistor 91. The collectors of the transistors 88 and 89 are connected to the bases of the transistors 90 and 93.

The collectors of the transistors 90 and 91 are connected to the base of the transistor 96, the collectors of the transistors 93 and 94 serving as an output terminal Q are connected to the base of the transistor 95, and the collectors of the transistors 95 and 96 are connected to the base of the transistor 94. The base of the transistor 89 is an input terminal D, and the base of the transistor 92 is a reset input terminal R.

In the OR gate 84, the collectors of the pair of the transistors 97 and 98 are commonly connected to one another, and the collectors are connected to the base of the transistor 99. The constant current circuits 107 and 108 of 20 microamperes are connected to the respective collectors. The bases of the transistors 97 and 98 are input terminals, and an input signal G is applied to the former base while the latter base is connected to the collector of the transistor 102 which corresponds to the output terminal of the inverter gate 87. The collector of the transistor 99 which corresponds to an output terminal is connected to the trigger input terminal CK of the D latch 83.

In the inverter gates 85 to 87 constituting the inverting circuit 121, the collectors of the transistors 85, 86 and 87 are connected to constant current circuits 109, 110 and 111 of 10 microamperes, 120 microamperes and 10 microamperes in current value, respectively. The input signal G is applied to the base of the transistor 85 at the initial stage, and the bases of the transistors 101 and 102 are connected to the collectors of the transistors 100 and 101.

The delay time when the signal level is inverted by the three-stage inverter gates 85 to 87 is set so that the variation time from low to high is longer than the variation time from high to low. That is, the current gain hFE of the transistor 101 is equal to 120/10=12, and the current gain hFE of the transistor 102 is equal to 10/120=0.083, so that the operation speed of the transistor 102 (the variation speed from ON to OFF) is lower than the operation speed of the transistor 101. The details of this technique are described in JP-A-2004-128012, for example.

Next, the action of the third embodiment will be described with reference to FIGS. 8 and 9. FIG. 8 is a timing chart showing the circuit operation of the latch circuit 82. First, as shown in FIG. 8(*f*), a power-on reset signal is active to carry out initialization. As shown in FIG. 8(*a*), the input signal G is the gate control signal of FET 1*a*, and thus it is intermittently set to high level in accordance with the current supply timing of the coil 2. The level of the input signal G is inverted by the inverting circuit 121 (b), and a delay time of 1 microsecond is applied to the variation from high to low while a delay time of 2 microseconds is applied to the variation from low to high. The logical addition between the input signal G and the inverted input signal G is carried out in the OR gate 84, and thus a trigger signal which is set to low level during only the period when both the input signal G and the inverted input signal G are set to low level is output to the D latch 83 (FIG. 8(*c*)).

A delay time of 20 microseconds is applied to the output signal of the OR gate 74 by the delay circuit 81. Accordingly, when short circuit is detected and the OR gate 74 outputs high level substantially in synchronism with the input signal D, the level of the signal falls within 20 microseconds from the falling time of the input signal A (FIG. 8(*d*), current comparison detection signal). The D latch 83 latches the level of the input terminal D during the period when the trigger signal CK shown in FIG. 8(*c*) outputs a low level pulse of 2 microseconds or less, and the level thus latched is output from the output terminal Q (FIG. 8(*e*)).

FIG. 9 corresponds to FIG. 4. As described above, the output signal of the OR gate 74 is latched by the latch circuit 82, whereby the signal indicating the detection of the short circuit state can be stably output without needing any filter for removing noises like the case shown in FIG. 4. However, as shown in FIG. 9(*f*), the output signal of the latch circuit 82 is set to high level from the falling of LS2+, and thus the detection timing of the short circuit is delayed by the amount corresponding to one signal period. However, this is not substantially no problem.

As described above, according to the third embodiment, the abnormality monitoring signal generating circuit 71 is constructed so that the logical addition of the signal levels at the A and B points at which the potential is varied when the transistor 28 or 34 is turned on is supplied with a delay time by the delay circuit 81 and then input to the latch circuit 82, and the latch circuit 82 carries out a (pseudo) latch operation at the negative edge of the gate control signal G applied to the power source side FET 1*a*. The logical product between the signal latched by the latch circuit 82 and the output signal of the inverter gate 80 is carried out in the NOR gate 75 to generate and output the abnormality monitoring signal DIAG. Accordingly, the state that the voltage signal at the A point or the B point is varied can be held by the latch circuit 82, and the holding of this state varies the output state of the abnormality monitoring signal DIAG, thereby surely reflecting the detection of the short circuit.

Furthermore, the latch circuit 82 carrying out the pseudo edge trigger operation is constructed by a bipolar transistor logic. That is, the logic product between the gate control signal G and the inversion of the signal level thereof is carried out in OR (negative logic AND) gate 84, and a one-shot low level pulse is generated in accordance with the delay time difference applied by the inverter gates 85 to 87 to make the D latch 83 of the level edge trigger carry out the latch operation, whereby the pseudo edge trigger operation can be implemented by the bipolar transistor logic.

Furthermore, the inverting circuit 121 is constructed by connecting the three inverter gates 85 to 87 in series, and the operating speed of the transistor 102 constituting the inverter gate 87 disposed at the last stage is set to a value lower than the operating speeds of the other transistors 100, 101. Therefore, when a delay time for generating a one-shot pulse having a predetermined width with which the D latch 83 is triggered is applied to at the falling edge of the gate control signal G, the number of the stages of inverter gates can be reduced to a smaller number.

The present invention is not limited to the embodiments described above and shown in the figures, and the following modifications or expansion is possible.

In the first embodiment, the diodes 44 and 45 may be provided in accordance with the required detection precision.

Furthermore, in the second embodiment, the resistors 60, 61, 62 and 63 are also provided as occasion demands.

With respect to the diodes 51*a* to 51*c*, 58*a* to 58*c*, they may be disposed in connection with a case where it is needed to adjust the output voltage ranges of the operational amplifiers 52, 53. For example, only one diode may be inserted in accordance with the adjustment level, or no diode may be disposed.

Furthermore, in the second embodiment, the operational amplifiers 52 and 53 may be deleted in accordance with the required detection precision. When the operational amplifier 53 is deleted, the collector side of the current mirror circuit 54 is connected to the power supply line 21 through the resistance element.

The mirror ratio set for the current mirror circuits 22, 23 may be properly changed in accordance with the current balance threshold value to detect the short circuit state.

Which one of FET and bipolar transistor should be used for each transistor may be properly selected in accordance with an individual design.

In the third embodiment, when the short circuit detecting circuit is constructed by using the CMOS process or Bi-CMOS process, the edge trigger D latch may be constructed by CMOS logic.

The low level pulse width of the trigger signal CK may be properly set in a range above a hold time which is needed for the level trigger D latch 83 to carry out the latch operation.

The inverting circuit may be constructed so that the delay time to be applied is equal between the rising time and the falling time of the output signal.

The number of the stages of the inverter gates constituting the inverting circuit may be equal to an odd number of five or more. Furthermore, if it is possible to apply the delay time which enables the hold time of the level trigger to be secured, the inverting circuit may be constructed by one inverter gate.

The invention claimed is:

1. A short circuit detecting circuit comprising:
a power supply side transistor connected between a power supply and a load;
a first detecting transistor that is mirror-paired with the power supply side transistor;
a ground side transistor connected between the load and ground;
a second detecting transistor that is mirror-paired with the ground side transistor;
first and second current mirror circuits constructed by transistor pairs for flowing currents corresponding to a mirrored current of a first current flowing in the first detecting transistor and a mirrored current of a second current flowing in the second detecting transistor respectively, wherein the first current mirror circuit has a current ratio that is larger at a first current side, wherein the second current mirror circuit has a current ratio that is larger at a second current side;
a first judging transistor that is connected to the first current side of the first current mirror circuit and conducted when the first current is larger than the second current; and
a second judging transistor that is connected to the second current side of the second current mirror circuit and conducted when the second current is larger than the first current.

2. A short circuit detecting circuit comprising:
a power supply side transistor connected between a power supply and a load;
a first detecting transistor that is mirror-paired with the power supply side transistor;
a ground side transistor connected between the load and ground;
a second detecting transistor that is mirror-paired with the ground side transistor;
first and second current mirror circuits constructed by transistor pairs for flowing currents corresponding to a mirrored current of a first current flowing in the first detecting transistor and a mirrored current of a second current flowing in the second detecting transistor respectively, wherein the first current mirror circuit has a current ratio that is larger at a first current side, wherein the second current mirror circuit has a current ratio that is larger at a second current side;
a first judging transistor that is connected to the first current side of the first current mirror circuit and conducted when the first current is larger than the second current;
a second judging transistor that is connected to the second current side of the second current mirror circuit and conducted when the second current is larger than the first current;
a third current mirror circuit in which a main transistor is connected to ground side of the first detecting transistor, a first assistant transistor is connected to the ground side of an assistant transistor at which the current ratio of the first current mirror circuit is large, a second assistant transistor is connected to ground side of the main transistor at which the current ratio of the second current mirror circuit is small, and common terminals are connected to a power supply side of the load; and
a fourth current mirror circuit in which a main transistor is connected to ground side of the second detecting transistor, a first assistant transistor is connected to the ground side of the main transistor at which the current ratio of the first current mirror circuit is small, a second assistant transistor is connected to ground side of an assistant transistor at which the current ratio of the second current mirror circuit is large, and common terminals are connected to the ground, wherein the first judging transistor is conducted when current flowing through the first assistant transistor of the third current mirror circuit is increased and thus current flowing through the assistant transistor of the first current mirror circuit is larger than current flowing through the mirror-paired main transistor, and the second judging transistor is conducted when current flowing through the second assistant transistor of the fourth current mirror circuit is increased, and thus current flowing through the assistant transistor of the second current mirror circuit is larger than current flowing through the mirror-paired main transistor.

3. The short circuit detecting circuit according to claim 2, wherein diodes is inserted in a forward direction between a control terminal and the power supply side transistor and the ground side transistor.

4. A short circuit detecting circuit comprising:
a power supply side transistor connected between a power supply and a load;
a first detecting transistor that is mirror-paired with the power supply side transistor;
a ground side transistor connected between the load and ground;
a second detecting transistor that is mirror-paired with the ground side transistor;
first and second current mirror circuits constructed by transistor pairs for flowing currents corresponding to a mirrored current of a first current flowing in the first detecting transistor and a mirrored current of a second current flowing in the second detecting transistor respectively, wherein the first current mirror circuit has a current ratio that is larger at a first current side, wherein the second current mirror circuit has a current ratio that is larger at a second current side;
a first judging transistor that is connected to the first current side of the first current mirror circuit and conducted when the first current is larger than the second current;
a second judging transistor that is connected to the second current side of the second current mirror circuit and conducted when the second current is larger than the first current;
a third current mirror circuit in which a main transistor is connected to ground side of the first detecting transistor, a first assistant transistor is connected to ground side of an assistant transistor at which the current ratio of the first current mirror circuit is large, a second assistant transistor is connected to the ground side of the main transistor at which the current ratio of the second current mirror circuit is small, and common terminals are connected to the ground through a resistor;
a fourth current mirror circuit in which a main transistor is connected to power supply side of the second detecting transistor, a first assistant transistor is connected to ground side of the main transistor at which the current ratio of the first current mirror circuit is small, a second assistant transistor is connected to ground side of an assistant transistor at which the current ratio of the second current mirror circuit is large, and common terminals are connected to the ground;

a fifth current mirror circuit in which the ground side of a main transistor is connected to the power supply side of the second detecting transistor, an assistant transistor is connected to the power supply side of the main transistor of the fourth current mirror circuit, and common terminals are connected to ground through a resistance element;

a first operation amplifier in which a non-inverting input terminal and an inverting input terminal are connected to the power supply side transistor and ground side of the first detecting transistor respectively, and an output terminal is connected to ground side of the third current mirror circuit; and a second operational amplifier in which a non-inverting input terminal and an inverting input terminal are connected to the ground side transistor and power supply side of the second detecting transistor respectively, and an output terminal is connected to the power supply side of the fifth current mirror circuit, wherein the first judging transistor is conducted when current flowing through the first assistant transistor of the third current mirror circuit is increased and thus current flowing through the assistant transistor of the first current mirror circuit is larger than current flowing through the mirror-paired main transistor, and the second judging transistor is conducted when current flowing through the second assistant transistor of the fourth current mirror circuit through the fifth current mirror circuit is increased, and thus current flowing through the assistant transistor of the second current mirror circuit is larger than current flowing through the mirror-paired main transistor.

5. The short circuit detecting circuit according to claim 4, further comprising:
a first diode inserted between the ground side of the first detecting transistor and the main transistor of the third current mirror circuit; and
a second diode inserted between the power supply side of the second detecting transistor and the main transistor of the fifth current mirror circuit.

6. The short circuit detecting circuit according to claim 4, wherein an offset adjusting resistance element disposed between the power supply, the ground is inserted at the output terminal of the first and second operational amplifiers.

7. An abnormality monitoring signal generating circuit comprising:
a power supply side transistor connected between a power supply and a load;
a first deteeting transistor that is mirror-paired with the power supply side transistor;
a ground side transistor connected between the load and ground;
a second detecting transistor that is mirror-paired with the ground side transistor;
first and second current mirror circuits constructed by transistor pairs for flowing currents corresponding to a mirrored current of a first current flowing in the first detecting transistor and a mirrored current of a second current flowing in the second detecting transistor respectively, wherein the first current mirror circuit has a current ratio that is larger at a first current side, wherein the second current mirror circuit has a current ratio that is larger at a second current side;
a first judging transistor that is connected to the first current side of the first current mirror circuit and conducted when the first current is larger than the second current;
a second judging transistor that is connected to the second current side of the second current mirror circuit and conducted when the second current is larger than the first current;
a logical addition gate for carrying out logical addition between voltage signals that vary in connection with the conduction of the first and second judging transistors;
a first delay circuit for applying a predetermined delay time to a signal output from the logical addition gate;
a latch circuit to which a signal delayed by the first delay circuit is input, and which carries out a latch operation on the basis of variation of a signal output in synchronism with the output timing of a control signal for conducting any one of the power supply side transistor and the ground side transistor; and
a logical product gate for carrying out the logical product between the signal latched by the latch circuit and the synchronous signal.

8. The abnormality monitoring signal generating circuit according to claim 7, wherein the latch circuit is constructed by a bipolar transistor logic, and comprises:
an inverting circuit for inverting the level of the synchronous signal;
a logical product gate for carrying out the logical product between the synchronous signal and an output signal of the inverting circuit; and
a level trigger D latch for carrying out a latch operation on the basis of level variation of the output signal of the logical product gate.

9. The abnormality monitoring signal generating circuit according to claim 8, wherein the inverting circuit comprises an odd number of three or more of inverter gates that are connected to one another in series, and the operation speed when the transistor constituting the inverter gate disposed at the last stage is varied from ON to OFF is set to be lower than the operation speed of the other transistors.

* * * * *